(12) United States Patent
Chen et al.

(10) Patent No.: US 8,324,035 B2
(45) Date of Patent: Dec. 4, 2012

(54) MANUFACTURING METHOD OF SOI MOS DEVICE ELIMINATING FLOATING BODY EFFECTS

(75) Inventors: Jing Chen, Shanghai (CN); Jiexin Luo, Shanghai (CN); Qingqing Wu, Shanghai (CN); Xiaolu Huang, Shanghai (CN); Xi Wang, Shanghai (CN)

(73) Assignee: Shanghai Institute of Microsystem and Information Technology, Chinese Academy of Sciences, Shaghai (CN)

( * ) Notice: Subject to any disclaimer, the term of this patent is extended or adjusted under 35 U.S.C. 154(b) by 0 days.

(21) Appl. No.: 13/128,914

(22) PCT Filed: Sep. 8, 2010

(86) PCT No.: PCT/CN2010/076710
§ 371 (c)(1),
(2), (4) Date: May 12, 2011

(87) PCT Pub. No.: WO2012/003660
PCT Pub. Date: Jan. 12, 2012

(65) Prior Publication Data
US 2012/0115287 A1 May 10, 2012

(30) Foreign Application Priority Data

Jul. 6, 2010 (CN) .......................... 2010 1 0220198

(51) Int. Cl.
*H01L 21/00* (2006.01)
*H01L 21/84* (2006.01)
*H01L 21/336* (2006.01)
*H01L 21/44* (2006.01)

(52) U.S. Cl. ......... 438/163; 438/302; 438/305; 438/682

(58) Field of Classification Search .................. 438/163, 438/218, 294, 400, 219, 221, 295, 296, 404, 438/405, 410, 433, 197, 199, 783, 202, 207, 438/419, 655, 664, 682, 351, 349, 149, 479, 438/151, 153, 301–306
See application file for complete search history.

(56) References Cited

U.S. PATENT DOCUMENTS

| 2006/0081930 A1* | 4/2006 | Maegawa et al. ............. 257/347 |
| 2009/0305500 A1* | 12/2009 | Lu et al. ........................ 438/655 |
| 2010/0308405 A1* | 12/2010 | Cai et al. ....................... 257/347 |

* cited by examiner

*Primary Examiner* — Chuong A. Luu
(74) *Attorney, Agent, or Firm* — Michaud-Kinney Group LLP

(57) ABSTRACT

The present invention discloses a manufacturing method of SOI MOS device eliminating floating body effects. The active area of the SOI MOS structure according to the present invention includes a body region, a N-type source region, a N-type drain region, a heavily doped P-type region, wherein the N-type source region comprises a silicide and a buried insulation region and the heavily doped P-type region is located between the silicide and the buried insulation region. The heavily doped P-type region contacts to the silicide, the body region, the buried insulation layer and the shallow trench isolation (STI) structure respectively. The manufacturing method of the device comprises steps of forming a heavily doped P-type region via ion implantation method, forming a metal layer on a part of the surface of the source region, then obtaining a silicide by the heat treatment of the metal layer and the Si material below. The present invention utilizes the silicide and the heavily doped P-type region to form an ohmic contact in order to release the holes accumulated in the body region of SOI MOS device and eliminate SOI MOS floating body effects. Besides, the manufacturing process is simple and can be easily implement. Further, the manufacturing process according to the present invention will not increase chip area and is compatible with conventional CMOS process.

6 Claims, 3 Drawing Sheets

MANUFACTURING METHOD OF SOI MOS DEVICE ELIMINATING FLOATING BODY EFFECTS

FIELD OF THE INVENTION

The present invention relates to a manufacturing method of a MOS (Metal Oxide Semiconductor) device structure, and particularly to a manufacturing method of SOI MOS device eliminating floating body effects, which belongs to semiconductor manufacturing technology field.

BACKGROUND OF THE INVENTION

SOI means silicon on insulator. In SOI technology, the devices are fabricated on a very thin silicon film, the device and the substrate are separated by a buried oxide layer. Because of this kind of structure, the SOI technique has several significant advantages compared to bulk silicon, such as high speed and low power consumption due to the reduced parasitic capacitance. Full dielectric isolation of SOI CMOS device eliminates the occurrence of bulk-Si CMOS device latch-up and SOI full dielectric isolation make SOI technique have superior performances including high integration density, and good anti-radiation properties. SOI technique has been widely applied in many technical fields such as radio-frequency field, high voltage field and anti-radiation field. With the size of the device continuing to shrink, SOI technique will be probably the first choice of Si technology instead of bulk silicon.

According to whether the active body region is depleted, SOI MOS can be classified into partially depleted SOI MOS (PDSOI) and fully depleted SOI MOS (FDSOI). Generally, the top silicon film of fully depleted SOI MOS is thinner resulting in many disadvantages. In one hand, the thin silicon film has high cost, and in the other hand, the threshold voltage of the fully depleted SOI MOS is hard to control. Therefore, the partially depleted SOI MOS is widely used currently.

The active body region of PDSOI is partially depleted, so that the body region is suspended. The charge produced by impact ionization can't be removed rapidly, resulting in floating body effect which is the special characteristic of SOI MOS. As for SOI NMOS, the electrons in the drain region are collided and ionized to produce electron-hole pairs. The holes flow to the body region, and the floating effect of SOI MOS result in the accumulation of the holes in the body region, so as to raise the electric potential of the body region. Therefore, the threshold voltage of SOI NMOS is reduced and the leakage current is increased resulting in the warping displacements of the output characteristic curve $I_dV_d$, known as the Kink effect. The Kink effect which has negative effects on the performances and reliabilities of the device and the circuit should be eliminated. The Kink effects of SOI PMOS device is not so obvious because the electron-hole pairs produced via collision is much less than SOI NMOS due to the lower ionization rate of the holes in SOI PMOS.

In order to resolve the problem of partially depleted SOI MOS, the method of body contact is usually used to connect the "body" to a fixed electric potential such as the source region or the ground. Referring to FIG. 1a-1b, in a traditional T-type gate body-contact structure, the P+ implantation region formed in one side of the T-type gate is connected to the P-type body region under the gate. During the operation of the MOS devices, the carriers accumulated in the body region release via flowing through the P+ channel to reduce body region electric potential. However, there are still some disadvantages in this T-type gate body contact structure, including complex manufacturing process, increased parasitic effect, degraded electric properties and increased device area.

Given the above, there is a need for an improved manufacturing method of SOI MOS device eliminating floating body effects.

SUMMARY OF THE INVENTION

Consistent with some embodiments of the present invention, a manufacturing method of MOS device structure effectively eliminating SOI floating body effects via silicide technology is provided.

The manufacturing method of MOS device structure effectively eliminating SOI floating body effects comprises steps of:

(a) form a shallow trench isolation structure on a Si material having the buried insulation layer to isolate an active region, and creating a gate region on the active region;

(b) performing lightly source and drain region doping with relatively high dose to form a lightly doped N-type source region with high doping concentration and a lightly doped N-type drain region with high doping concentration; wherein the implantation dose of the lightly source and drain region doping could reach the magnitude of $1e15/cm^2$, and the concentration of the lightly doped N-type source region and the lightly doped N-type drain region could reach the magnitude of $1e19/cm^3$;

(c) providing a spacer structure around the gate region, wherein the spacer structure covers a part of the surfaces of the lightly doped N-type source region and the lightly doped N-type drain region, and forming a P-type region under the lightly doped N-type source region by heavily doping via ion implantation downward from the surface of the lightly doped N-type source and drain region which are not covered by the spacer structure;

(d) forming an N-type Si source region and an N-type drain region via once ion implantation and forming a body region between the N-type Si source region and the N-type drain region, and retaining some of the P-type region between the N-type Si source region and the buried insulation layer as a heavily doped P-type region;

(e) forming a metal layer on a part of the surface of the N-type Si source region, then obtaining a silicide by the reaction of the metal layer with the Si material below during heat treatment, and contacting the silicide with the heavily doped P-type region; wherein the remaining Si material which does not react with the metal layer is treated as an N-type Si region, and an N-type source region is formed of the silicide obtained and the N-type Si region.

DETAILED DESCRIPTION OF THE EMBODIMENTS

The present invention is further explained in detail according to the accompanying drawings. It should be noted that figures are schematic representations of devices, and not drawn to scale.

Figure 1A:
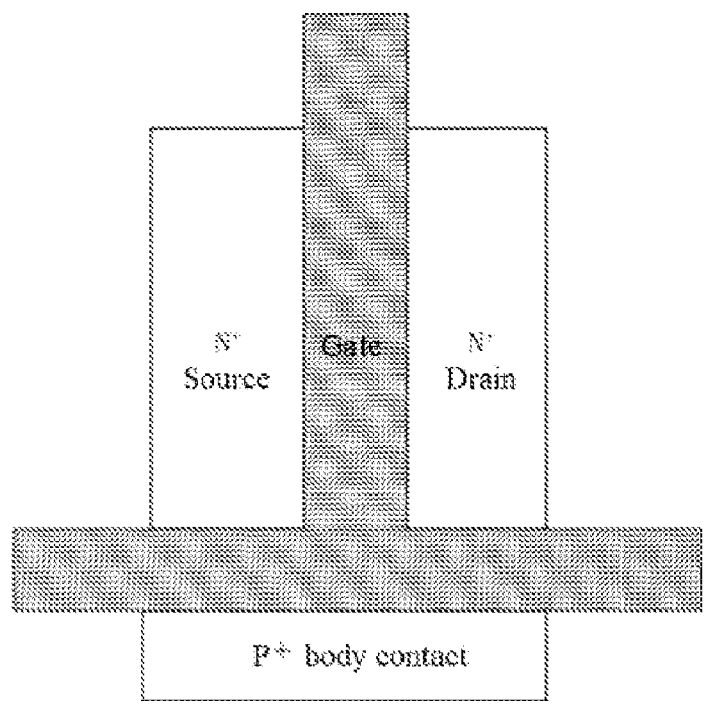
FIG. 1a is a top view of a MOS device eliminating floating body effects according to the method of body contact in prior art.
Figure 1B:
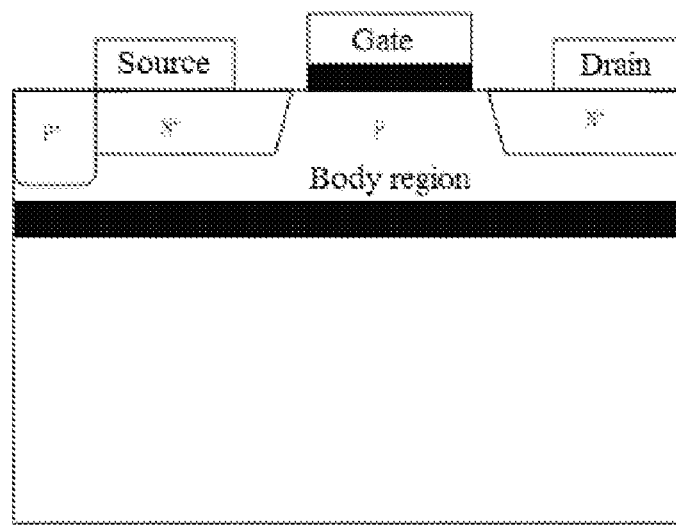
FIG. 1b is a cross sectional view of a MOS device eliminating floating body effects according to the method of body contact in prior art.
Figure 2A:
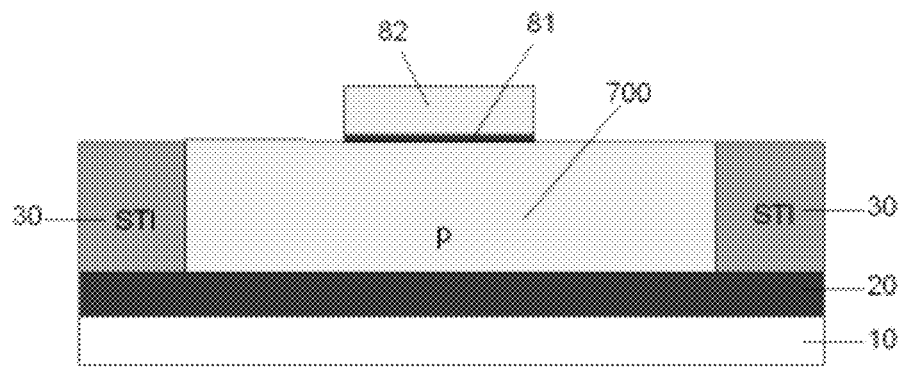
FIG. 2a-2e are some schematic views of the manufacturing process of a MOS device utilizing the method according to the present invention.
Figure 2B:
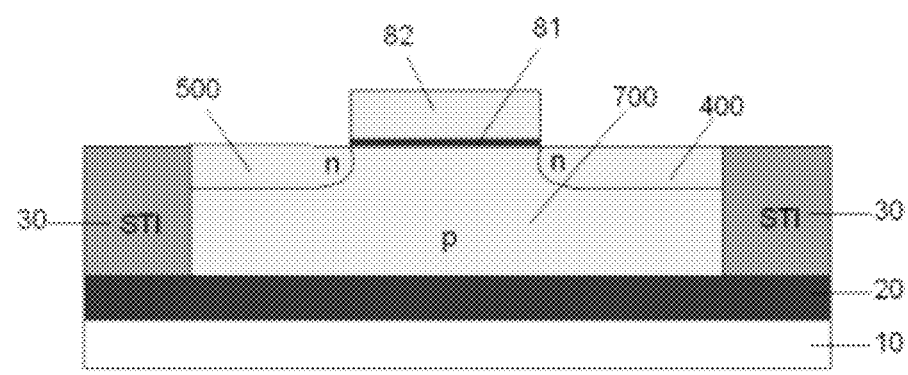
Figure 2C:
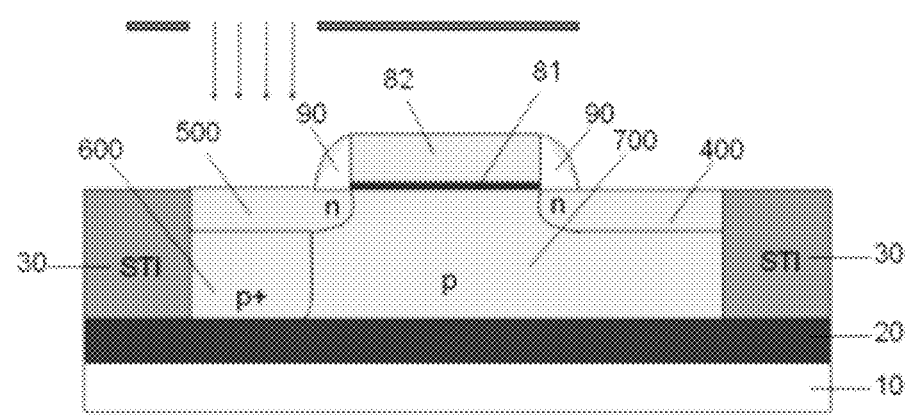
Figure 2D:
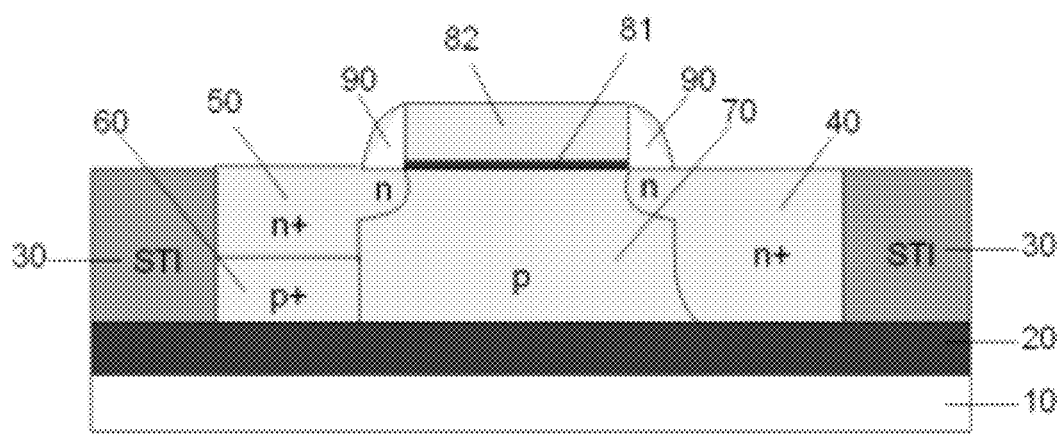
Figure 2E:
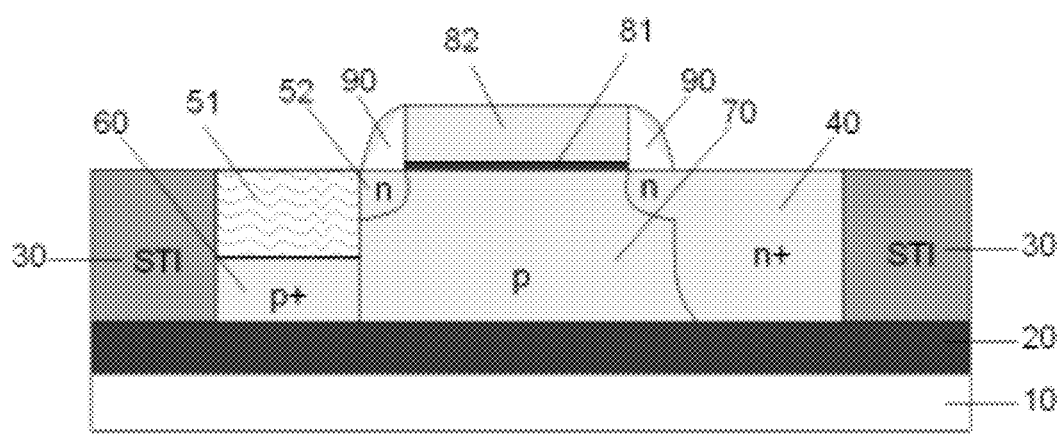

Referring to FIG. 2e, the present embodiment provides a MOS device eliminating floating body effects, includes a Si substrate 10, a buried insulation layer 20 located on the Si substrate 10, an active region located on the buried insulation layer 20; a gate region located on the active region and a shallow trench isolation (STI) structure 30 provided surrounding the active region.

The active region includes a body region 70, an N-type source region, an N-type drain region 40, a heavily doped P-type region 60. The N-type source region is composed of a silicide 51 and an N-type Si region 52 which is connected to the silicide 51. The N-type source region and the N-type drain region 40 are located in both sides of the body region 70 respectively. The heavily doped P-type region 60 is located between the silicide 51 of the N-type source region and the buried insulation layer 20, and the heavily doped P-type region 60 contacts to the silicide 51, the body region 70, the buried insulation layer 20 and the shallow trench isolation (STI) structure 30 respectively. The N-type Si region 52 and the body region 70 are in contact with each other.

The gate region includes a gate dielectric layer 81 and a gate electrode 82 located on the gate dielectric layer 81. An insulation spacer 90 is provided surrounding the gate region. The active region is formed of Si material. The body region 70 could be formed of P-type Si material. The N-type drain region 40 is formed of N-type Si material. The buried insulation layer 20 could be formed of silicon oxide, silicon nitride other materials. Consistent with one preferable embodiment of the present invention, the buried insulation layer 20 is a buried oxide (BOX) which is formed of $SiO_2$. The silicide 51 could be formed of any conductive silicide, such as cobalt silicide or titanium silicide, to form an ohmic contact with the below heavily doped P-type region 60 in order to release the holes accumulated in the body region of SOI MOS device and eliminate SOI MOS floating body effects. The Kink effect is not obvious in SOI PMOS, so the present invention is mainly aimed at the SOI NMOS device.

A manufacturing method of SOI MOS device eliminating floating body effects includes the following steps.

(a) form a shallow trench isolation structure 30 on a Si material having the buried insulation layer 20 (SOI) to isolate an active region 700, according to priority create a gate dielectric layer 81 and a gate electrode 82 on the active region 700, wherein the gate electrode 82 adopts multicrystal silicon materials and implant P-type ion into the active region to adjust the threshold voltage before creating the gate region (referring to FIG. 2a).

(b) form a lightly doped source (LDS) and a lightly doped drain (LDD) via high dose source and drain doping process; in this step, the actual lightly doped source and drain N-type implantation dose in the present invention reaches the magnitude of $1e15/cm^2$, which is different from traditional LDD/LDS in prior art. The lightly doped N-type source region 500 and lightly doped N-type drain region 400 both have high doping concentration which actually reaches the magnitude of $1e19/cm^3$. However, in order to distinguish from the source and drain implantation, this procedure is still called LDD/LDS which has been used before (referring to FIG. 2b).

(c) provide a spacer structure 90 around the gate region adopting silicon oxide, silicon nitride or other materials to cover a part of the surfaces of the lightly doped N-type source region 500 and the lightly doped N-type drain region 400, then form a P-type region 600 under the lightly doped N-type source region 500 by heavily doping via ion implantation downward from the surface of the lightly doped N-type source and drain region which are not covered by the spacer structure 90. Referring to FIG. 2c, in one of the embodiments, a mask with an opening at a position of the lightly doped N-type source region 500 is adopted to vertically heavily implant P ions underneath the lightly doped N-type source region 500 to form a P-type region 600.

(d) form an N-type Si source region 50 and an N-type drain region 40 via once source and drain ion implantation and form a body region 70 between the N-type Si source region 50 and the N-type drain region 40, and retain some of the P-type region 600 between the N-type Si source region 50 and the buried insulation layer 20 as a heavily doped P-type region 60 (referring to FIG. 2d). In step (b), the heavily doped LDD/LDS process adopted ensures that the channel current still flows out from the source region through the N-type LDS and the source/drain resistance is low. Therefore, in the present step, there is only once source and drain ion implantation required to form an N-type Si source region 50 and an N-type drain region 40 and there is no need for a second source/drain implantation via a second side wall etching process.

(e) form a metal layer, such as a Co or Ti layer, on a part of the surface of the N-type Si source region 50, then obtain a silicide 51 by the reaction of the metal layer with the Si material below during heat treatment, and contact the silicide 51 with the heavily doped P-type region 60, and form an N-type Si region 52 by the remaining Si material which does not react with the metal layer. The heat treatment could adopt furnace annealing process with the temperature ranging from 700° C. to 900° C., preferably 800° C. and the annealing time ranging from 50s to 70s, preferably 1 minute. The silicide produced by the reaction of Co and Si is cobalt silicide and the silicide produced by the reaction of Ti and Si is titanium silicide. An N-type source region is formed by the silicide 51 and the N-type Si region 52. The manufacturing process of the MOS device is finished.

The advantages of the manufacturing method of SOI MOS device eliminating floating body effects according to the present invention are listed as below. There is a heavily doped P-type region below the source region in the structure of the present invention; the source silicide passes through the source N-type and forms an ohmic contact with the below heavily doped P-type region to release the holes accumulated in the body region of SOI MOS device and eliminate SOI MOS floating body effects. Besides, the manufacturing process is simple and can be easily implement. Further, the manufacturing process according to the present invention will not increase chip area and is compatible with conventional CMOS process.

What is claimed is:

1. A manufacturing method of silicon on insulator (SOI) metal oxide semiconductor (MOS) device eliminating floating body effects comprising steps of:

(a) forming a shallow trench isolation structure on a Si material having the buried insulation layer to isolate an active region, and creating a gate region on the active region;

(b) performing lightly source and drain region doping with high dose to form a lightly doped N-type source region with high doping concentration and a lightly doped N-type drain region with high doping concentration; wherein doping the lightly doped source and drain region at a dose of about 1e15/cm2, and the concentration of the lightly doped N-type source region and the lightly doped N-type drain region is set to about 1e19/cm3;

(c) providing a spacer structure around the gate region, wherein the spacer structure covers a part of the surfaces of the lightly doped N-type source region and the lightly doped N-type drain region, and a mask with an opening thereon which is aligned with the edge of the spacer structure at a position of the lightly doped N-type source region is adopted to vertically heavily implant P ions underneath the lightly doped N-type source region to form a P-type region;

(d) forming an N-type Si source region and an N-type drain region via once ion implantation and forming a body region between the N-type Si source region and the N-type drain region, and retaining some of the heavily doped P-type region between the N-type Si source region and the buried insulation layer as a heavily doped P-type region; and (e) forming a metal layer on a part of the surface of the N-type Si source region, then obtaining a silicide by the reaction of the metal layer with the Si material below during heat treatment, and contacting the silicide with the heavily doped P-type region in order to form an ohmic contact to release the holes accumulated in the body region of SOI MOS device and eliminate SOI MOS floating body effects; wherein the remaining Si material which does not react with the metal layer is treated as an N-type Si region, and an N-type source region is formed of the silicide obtained and the N-type Si region.

2. The method of manufacturing a MOS device of claim 1, wherein in step (a), P-type ion implantation is adopted to the active region before creating the gate region.

3. The method of manufacturing a MOS device of claim 1, wherein in step (e), the metal adopted is selected from one of the group consisting of Co and Ti.

4. The method of manufacturing a MOS device of claim 1, wherein in step (e), furnace annealing process is adopted in the heat treatment.

5. The method of manufacturing a MOS device of claim 1, wherein in step (e), the temperature of the heat treatment is ranging from 700 to 900 and the time of the heat treatment is ranging from 50s to 70s.

6. The method of manufacturing a MOS device of claim 4, wherein in step (e), the temperature of the heat treatment is ranging from 700 to 900 and the time of the heat treatment is ranging from 50s to 70s.

* * * * *